(12) United States Patent
Komoda

(10) Patent No.: US 6,925,624 B2
(45) Date of Patent: Aug. 2, 2005

(54) CIRCUIT MODIFICATION METHOD

(75) Inventor: Michio Komoda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 308 days.

(21) Appl. No.: 09/921,604

(22) Filed: Aug. 6, 2001

(65) Prior Publication Data

US 2002/0060572 A1 May 23, 2002

(30) Foreign Application Priority Data

Nov. 20, 2000 (JP) ......................................... 2000-352458

(51) Int. Cl.[7] ............................. G06F 9/45; G06F 17/50
(52) U.S. Cl. ................................. 716/10; 716/9; 716/10
(58) Field of Search ............................. 716/6–11, 2, 4; 702/58, 64; 327/379

(56) References Cited

U.S. PATENT DOCUMENTS 5,568,395 A * 10/1996 Huang ............................ 716/4
6,117,182 A * 9/2000 Alpert et al. .................... 716/8
6,378,109 B1 * 4/2002 Young et al. .................... 716/4

FOREIGN PATENT DOCUMENTS

JP 8-102491 4/1996
JP 2000-137554 5/2000

OTHER PUBLICATIONS

R. Levy, et al., "ClariNet: A noise analysis tool for deep submicron design", p. 233, (http://www.sigda.acm.org/Archives/ProceedingArchives/Dac/Dac2000/papers/2000/dac00/htmfiles/sun_sgi/dacabs.htm#14_1).

* cited by examiner

*Primary Examiner*—Matthew Smith
*Assistant Examiner*—Naum Levin
(74) *Attorney, Agent, or Firm*—Burns, Doane, Swecker & Mathis, LLP

(57) ABSTRACT

In accordance with a circuit modification method, when it is determined that an aggressor (2) causes a glitch error in a victim (1), the one or more positions where one or more buffers are to be inserted into the victim (1) are determined based on the coupling capacity Cc between the victim (1) and the aggressor (2). One or more buffers are inserted at one or more internal points of division of the victim (1) which are determined so that the coupling capacity between each of a plurality of wire segments, into which the victim is to be divided by the one or more internal points of division, and the aggressor 2 is equal to Cc/n, where n is the number of wire segments. Furthermore, since the one or more buffers are inserted so that the coupling capacity Cc is properly divided into the coupling capacities between the plurality of wire segments and the aggressor, the amount of glitch to be caused in each of plurality of wire segment can be reduced and no further addition of buffers is needed.

18 Claims, 8 Drawing Sheets

FIG.6

| CELL TYPE | PARAMETERS | | | |
|---|---|---|---|---|
| | AREA | DRIVING ABILITY | ... | ... |
| INVERTER 1 | $X1(\mu m^2)$ | $Y1(\Omega)$ | · | · |
| INVERTER 2 | $X2(\mu m^2)$ | $Y2(\Omega)$ | · | · |
| ⋮ | ⋮ | ⋮ | ⋮ | ⋮ |
| DRIVER 1 | $X3(\mu m^2)$ | $Y3(\Omega)$ | · | · |
| DRIVER 2 | $X4(\mu m^2)$ | $Y4(\Omega)$ | · | · |
| ⋮ | ⋮ | ⋮ | ⋮ | ⋮ |
| NAND1 | $X5(\mu m^2)$ | $Y5(\Omega)$ | · | · |
| NAND2 | $X6(\mu m^2)$ | $Y6(\Omega)$ | · | · |
| ⋮ | ⋮ | ⋮ | ⋮ | ⋮ |

CIRCUIT MODIFICATION METHOD

BACKGROUND OF THE INVENTION

1. Field of the Invention

The present invention relates to a circuit modification method of modifying a circuit when a glitch having an unacceptable level occurs in a wire within the circuit under the influence of other wires.

2. Description of the Prior Art

In the case where a wire 2 is located in the vicinity of another wire 1 within a semiconductor integrated circuit, as shown in FIG. 1(*a*), if a voltage change occurs in the wire 2, a pulsed signal wave can occur in the wire 1 because of a coupling capacity between these wires. This phenomenon is known as "glitch". A wire influenced by another wire is called victim, and a wire that influences another wire is called aggressor. In the case of FIGS. 1(*a*) and 1(*b*), the wire 1 is a victim, and the other wire 2 is an aggressor.

FIG. 2 shows voltage changes in the wires 1 and 2 when a glitch occurs in the wire 1. The horizontal axis of this graph indicates time, and the vertical axis indicates voltage values. With the wire 1 fixed to a power-supply voltage (1.5 Volts) by a driver 3, for example, when another driver 4 causes the voltage of the wire 2 to change from the power-supply voltage (1.5 Volts) to a ground voltage (0 Volts), there causes a glitch in the wire 1, the voltage of which drops once and then returns to the power-supply voltage, because of the coupling capacity Cc between the two wires 1 and 2. When a maximum amount of voltage change caused in the wire 1 is assumed to be the amount of glitch, there is a possibility that the next stage of the circuit connected to the wire 1 malfunctions because of the glitch if the amount of glitch is too large. Therefore, it is necessary to determine that a glitch error occurs when the amount of glitch exceeds a certain acceptable level, and to modify the circuit so as to reduce the amount of glitch. In the case where the wire 1 is fixed to a ground voltage, when the wire 2 changes from the ground voltage to the power-supply voltage, a glitch can similarly occur in the wire 1.

A glitch analysis method is disclosed by Rafi Levy, David Blaauw, Gabi Braca, Aurobindo Dasgupta, Amir Grinshpon, Chanhee Oh, Boaz Orshav, Supamas Sirichotiyakul and Vladimir Zolotov, "14.1 Clarinet: A noise analysis tool for deep submicron design", p.233, (http://www.sigda.acm.org/Archives/ProceedingArchives/Dac/D ac2000/papers/2000/dac00/htmfiles/sun_sgi/dacabs.htm#14_1).

There is, as a prior art circuit modification method, a technique of inserting only one buffer (i.e., driver) 5 at the midpoint of the wire 1, as shown in FIG. 1(*b*) so as to prevent a glitch error from occurring in the wire 1. Since the buffer insertion divides the coupling capacity Cc between the two wires 1 and 2 into the coupling capacity $Cc_1$ between a wire 1*a* and the wire 2 and the coupling capacity $Cc_2$ between a wire 1*b* and the wire 2, the wire 1 being divided into the wires 1*a* and 1*b*, the amounts of glitches to be caused in the wires 1*a* and 1 *b* respectively can be lower than the amount of glitch to be caused in the wire 1 in the case of FIG. 1(*a*). The method of modifying the circuit can be implemented via a computer program.

However, when the other wire 2 is located in the vicinity of the wire 1 such that the other wire 2 is apart from the midpoint of the wire 1, e.g., when the other wire 2 is adjacent to the next-stage side of the wire 1 as shown in FIG. 3, if the buffer 5 is located at the midpoint A of the wire 1, the coupling capacity between the wire 1*a*, which is the one of the two parts of division far from the other wire 2, and the other wire 2 becomes too small, and the amount of glitch to be caused in the wire 1*a* becomes zero roughly. In contrast, the coupling capacity $Cc_2$ between the wire 1*b*, which is the one nearer to the other wire 2, and the other wire 2 is almost equal to the coupling capacity Cc between the wires 1 and 2 in the case of FIG. 1(*a*), the amount of glitch to be caused in the wire 1*b* is hardly reduced. Other factors might increase the amount of glitch. It is therefore necessary to further insert another buffer at the midpoint of the wire 1*b*.

In such a prior art circuit modification method, even if two adjacent wires have any relationship between them, since a step of inserting an additional buffer at the midpoint of a wire which is a victim is repeated until no glitch error occurs, the number of buffers to be inserted into the victim is increased. This results in an increase in either the area or power consumption of the circuit.

Since only one type of predetermined buffers are inserted into the victim in any case, either the area or power consumption of the circuit is increased if those inserted buffers have a larger driving ability than required. On the other hand, when the buffers do not have a sufficient driving ability, the glitch error cannot be eliminated and additional buffers are needed.

SUMMARY OF THE INVENTION

It is therefore an object of the present invention to provide a circuit modification method capable of preventing the number of buffers to be inserted into the circuit for the elimination of glitch errors from reaching to the over and above what is wanted.

It is another object of the present invention to provide a circuit modification method capable of eliminating glitch errors while limiting an increase in the area of the circuit.

It is a further object of the present invention to provide a circuit modification method capable of decreasing the amount of glitch, thereby carrying out the elimination of glitch errors more effectively.

In accordance with an aspect of the present invention, there is provided a circuit modification method of modifying a circuit by inserting one or more buffers into a predetermined wire located within the circuit, the method comprising the steps of: determining whether a glitch error is caused in the predetermined wire by one or more aggressors each comprised of one or more other wires; when determining that a glitch error is caused in the predetermined wire by one or more aggressors, determining one or more positions where one or more buffers are to be inserted into the predetermined wire based on a coupling capacity between each of the one or more aggressors and the predetermined wire. Therefore, in accordance with the circuit modification method, when one aggressor is located so that it is adjacent to the next-stage side part of the predetermined wire (i.e., victim), as shown in FIG. 3, one position to divide the coupling capacity between the victim and the aggressor into the coupling capacity between one wire segment 1*a* and the aggressor and the coupling capacity between one wire segment 1*b* and the aggressor can be determined as a position where one buffer is to be inserted into the victim, thereby reducing the number of buffers to be inserted into the victim.

In accordance with another aspect of the present invention, the insertion position determining step includes the steps of, when determining that a glitch error is caused in the predetermined wire by only one aggressor, calculating a target coupling capacity using the coupling capacity between the aggressor and the predetermined wire, and, when dividing the predetermined wire into a plurality of wire segments, determining one or more internal points of division of the predetermined wire so that a coupling capacity between each of the plurality of wire segments and the aggressor does not exceed the target coupling capacity, and setting the one or more internal points of division to the one or more positions where the one or more buffers are to be inserted into the predetermined wire. The target coupling capacity can be set to eliminate the glitch error. In this case, any glitch error can be prevented from being caused in the predetermined wire, into which the one or more buffers have been inserted, by the aggressor.

In accordance with a further aspect of the present invention, the target coupling capacity calculating step is the step of calculating the target coupling capacity by using an amount of glitch to be caused in the predetermined wire by the aggressor. The target coupling capacity can be easily set to eliminate the glitch error.

In accordance with another aspect of the present invention, the target coupling capacity calculating step includes the steps of determining the number of the plurality of wire segments based on the amount of glitch, and calculating the target coupling capacity based on the coupling capacity between the aggressor and the predetermined wire and the number of the plurality determined in the above step.

In accordance with a further aspect of the present invention, the wire segment number determining step is the step of, when the coupling capacity between the aggressor and the predetermined wire is Cc, the amount of the glitch is V and a predetermined value is Vmax, determining the smallest integer number n which satisfies a following relationship: $V/n \leq V\max$ as the number of the plurality of wire segments, and wherein the target coupling capacity calculating step is the step of calculating the target coupling capacity as follows: Cc/n, and the internal division point determining step is the step of determining the one or more internal points of division so that the coupling capacity between each of the plurality of wire segment and the aggressor is equal to the target coupling capacity Cc/n.

In accordance with another aspect of the present invention, the target coupling capacity calculating step is the step of, when the coupling capacity between the aggressor and the predetermined wire is Cc, the amount of glitch is V, and a predetermined value is Vmax, calculating the target coupling capacity as follows: Cc*Vmax/V.

In accordance with a further aspect of the present invention, the circuit modification method further comprises the steps of, when determining that a glitch error is caused in the predetermined wire by one or more aggressors, replacing a driving circuit for driving the predetermined wire with another one having a higher driving ability than the driving circuit, and, before performing the insertion position determining step, determining whether a glitch error is caused in the predetermined wire driven by the other driving circuit by the one or more aggressors.

In accordance with another aspect of the present invention, the insertion position determining step includes the steps of, when determining that a glitch error is caused in the predetermined wire by a plurality of aggressors, calculating a plurality of target coupling capacities respectively associated with the plurality of aggressors by using the coupling capacity between each of the plurality of aggressors and the predetermined wire, and, when dividing the predetermined wire into a plurality of wire segments, determining one or more internal points of division of the predetermined wire so that a coupling capacity between each of the plurality of wire segments and each of the plurality of aggressors does not exceed a corresponding one of the plurality of target coupling capacities, and setting the one or more internal points of division to the one or more positions where the one or more buffers are to be inserted into the predetermined wire. Each of the plurality of target coupling capacities can be set to eliminate the glitch error to be caused by the corresponding aggressor. In this case, any glitch error can be prevented from being caused in the predetermined wire, into which the one or more buffers have been inserted, by any of the plurality of aggressors.

In accordance with a further aspect of the present invention, the target coupling capacity calculating step includes the steps of, when the coupling capacity between each of the plurality of aggressors (referred to as ith (i=1 to k, k is the number of aggressors) aggressor hereafter) and the predetermined wire is $Cc_i$ (i=1 to k), an amount of glitch to be caused in the predetermined wire by the ith aggressor is $V_i$ (i=1 to k), and a predetermined value is Vmax, determining the smallest integer number $n_i$ (i=1 to k) which satisfies a following relationship: $V_i/n_i$ Vmax (i=1 to k) as the number of the plurality of wire segments for each of the plurality of aggressors, and calculating each of the plurality of target coupling capacities as follows: $Cc_i/n_i$ (i=1 to k).

In accordance with another aspect of the present invention, the insertion position determining step includes the steps of when dividing the predetermined wire into a plurality of wire segments for each of the plurality of aggressors, determining the one or more internal points of division of the predetermined wire so that the coupling capacity between each of the plurality of wire segment and each of the plurality of aggressor is equal to the corresponding target coupling capacity, and selecting the one or more positions where one or more buffers to be inserted into the predetermined wire from among all internal points of division determined in the above step for the plurality of aggressors.

In accordance with a further aspect of the present invention, the insertion position determining step includes the steps of when dividing the predetermined wire into a plurality of wire segments for each of the plurality of aggressors, i.e., the ith aggressor, determining the one or more internal points of division of the predetermined wire so that the coupling capacity between each of the plurality of wire segment and the ith aggressor is equal to the corresponding target coupling capacity $Cc_i/n_i$ (i=1 to k), and selecting the one or more positions where one or more buffers to be inserted into the predetermined wire from among all internal points of division determined in the above step for the plurality of aggressors.

In accordance with another aspect of the present invention, the target coupling capacity calculating step includes the steps of, when the coupling capacity between each of the plurality of aggressors (referred to as ith (i=1 to k, k is the number of aggressors) aggressor hereafter) and the predetermined wire is $Cc_i$ (i=1 to k), an amount of glitch to be caused in the predetermined wire by the ith aggressor is $V_i$ (i=1 to k), and a predetermined value is Vmax, calculating each of the plurality of target coupling capacities as follows: $Cc_i*V\max/V_i$ (i=1 to k).

In accordance with a further aspect of the present invention, there is provided a circuit modification method of modifying a circuit by inserting one or more buffers into a predetermined wire located within the circuit, the method comprising the steps of: determining whether a glitch error is caused in the predetermined wire by an aggressor comprised of one or more other wires; when determining that a glitch error is caused in the predetermined wire by an aggressor, determining a number of buffers to be inserted into the predetermined wire based on an amount of glitch to be caused in the predetermined wire by the aggressor. In accordance with the circuit modification method, since the number of buffers to be inserted can reflect the amount of glitch when the number of buffers is determined, the determined number of buffers is adequate for the elimination of the glitch error.

In accordance with another aspect of the present invention, the buffer number determining step is the step of, when the amount of glitch is V and a predetermined value is Vmax, calculating the smallest integer number n which satisfies a following relationship: $V/n \leq Vmax$. By setting Vmax to a target for the amount of glitch (if the amount of glitch to be caused is equal to or less than the target, it can be assumed that the glitch error is eliminated), the number of buffers to be inserted is (n−1). Thus, a smaller number of buffers to be inserted can be estimated.

In accordance with a further aspect of the present invention, the circuit modification method further comprises the steps of, when determining that a glitch error is caused in the predetermined wire by one aggressor, replacing a driving circuit for driving the predetermined wire with another one having a higher driving ability than the driving circuit, and, before performing the buffer number determining step, determining whether a glitch error is caused in the predetermined wire driven by the other driving circuit by the one aggressor.

In accordance with another aspect of the present invention, the one or more buffers to be inserted into the predetermined wire have a driving ability equal to or greater than that of a driving circuit for driving the predetermined wire. Accordingly, the amount of glitch to be caused in the predetermined wire into which the one or more buffers have been inserted can be further decreased.

In accordance with a further aspect of the present invention, the circuit modification method further comprises the step of selecting a type of buffer having a driving ability equal to or greater than that of the driving circuit for driving the predetermined wire and having a minimum area as each of the one or more buffers to be inserted into the predetermined wire from among a plurality of buffer cells stored in a cell library. Accordingly, an increase in the area of the circuit can be prevented as well as the amount of glitch to be caused in the predetermined wire into which the one or more buffers have been inserted can be further decreased.

In accordance with another aspect of the present invention, there is provided a circuit modification method comprising the steps of: determining whether a glitch error is caused in the predetermined wire by an aggressor comprised of one or more other wires; when determining that a glitch error is caused in the predetermined wire by an aggressor, replacing a driving circuit for driving the predetermined wire with another one having a higher driving ability than the driving circuit. The amount of glitch can be reduced because the driving ability of the driving circuit for driving the victim is improved. The elimination of the glitch error can be carried out more effectively.

Further objects and advantages of the present invention will be apparent from the following description of the preferred embodiments of the invention as illustrated in the accompanying drawings.

BRIEF DESCRIPTION OF THE DRAWINGS

FIG. 6 is a drawing showing the data structure of a cell library which the circuit modification method according to the first embodiment of the present invention employs;

DETAILED DESCRIPTION OF THE PREFERRED EMBODIMENTS

Figure 1A:
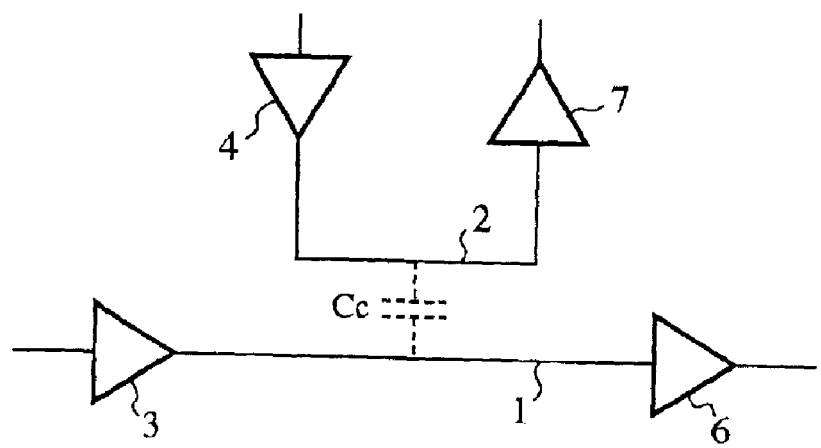
FIGS. 1(a) and 1(b) are explanatory drawings showing a procedure of a prior art circuit modification method.
Figure 1B:
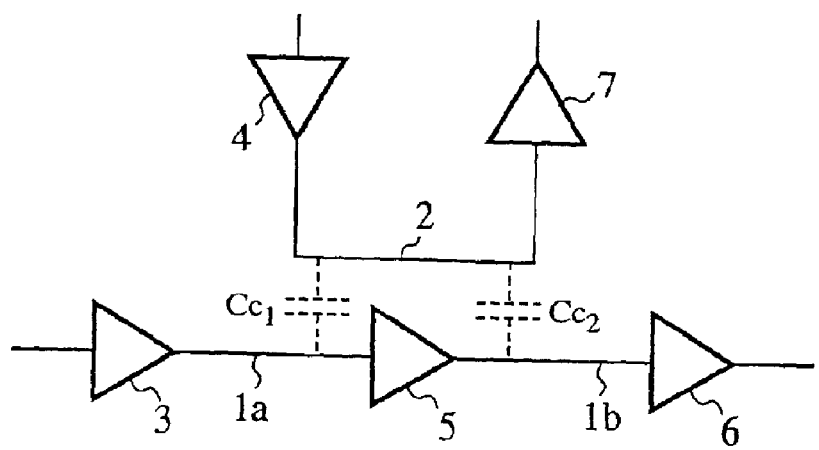

The preferred embodiments of the present invention will be explained hereafter with reference to the accompanied drawings. In the drawings, the same components or like components are designed by the same reference numerals.
Embodiment 1

Figure 3:
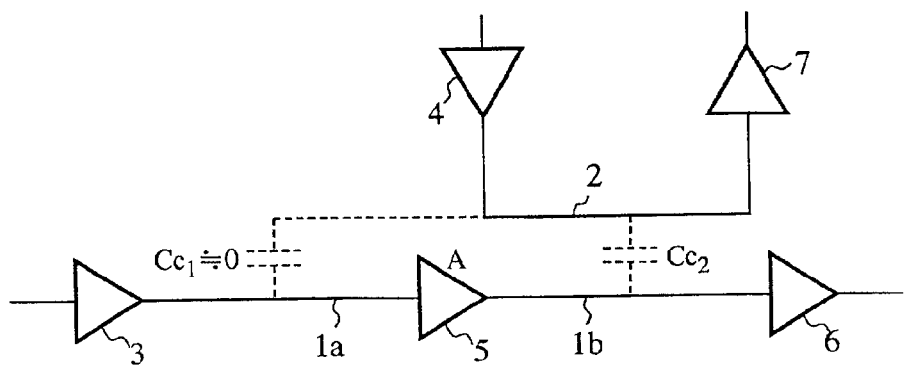
FIG. 3 is an explanatory drawing for explaining a problem with the prior art circuit modification method.
Figure 4A:
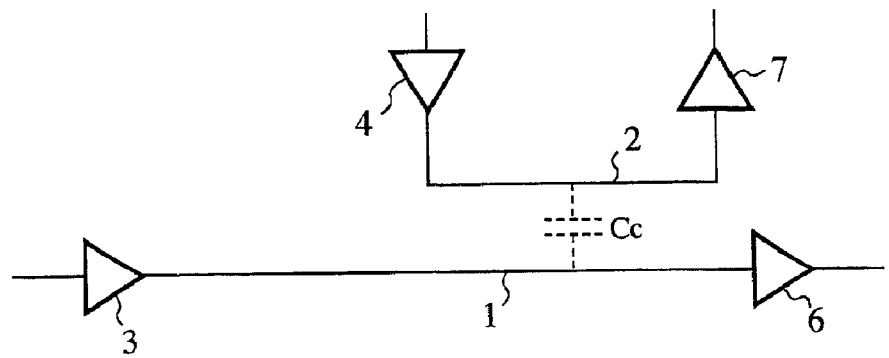
FIGS. 4(a) to 4(c) are explanatory drawings for explaining circuit modification processing performed by using a circuit modification method according to a first embodiment of the present invention.

FIG. 4(a) is a schematic circuit diagram showing a part of a semiconductor integrated circuit which is to be modified by using a circuit modification method according to a first embodiment of the present invention. It is assumed that the circuit of FIG. 4(a) is the same as the circuit of FIG. 3 in which the buffer 5 has not been inserted into the circuit yet. Drivers 3 and 4 drive wires 1 and 2 based on signals applied thereto, and set the voltages of the two wires to either a power-supply voltage or a ground voltage, respectively. Other drivers 6 and 7 receive the voltages of the wires 1 and 2, and drive wires disposed at the next stages, respectively. The wire 1 is adjacent to the other wire 2 at the next-stage side part thereof, as shown in FIG. 4(a). This circuit is the one which has already been layout-designed using a CAD (Computer Aided Design) tool.

A description will be made as to how the circuit is modified using the circuit modification method of the present embodiment when it is determined that a glitch caused in the wire 1 (referred to as victim 1 hereafter) by signal change in the other wire 2 (referred to as aggressor 2 hereafter) which is an aggressor causes a glitch error, with reference to a flow chart of FIG. 5(a).

The circuit modification method according to the first embodiment is implemented via a computer program (software) disposed as a CAD tool for layout verification. The computer program is recorded in a storage medium which computers can read. A computer can practice the circuit modification method of the first embodiment according to the program read out of the storage medium.

Although it is necessary to judge whether a glitch error occurs in any of all wires other than the victim 1 in the circuit including the aggressor 2, and to prevent the glitch error from occurring, only the judgment and modification as for the victim 1 will be explained hereafter because the same judgment and modification only has to be performed on any other victim according to the following procedure.

Figure 2:
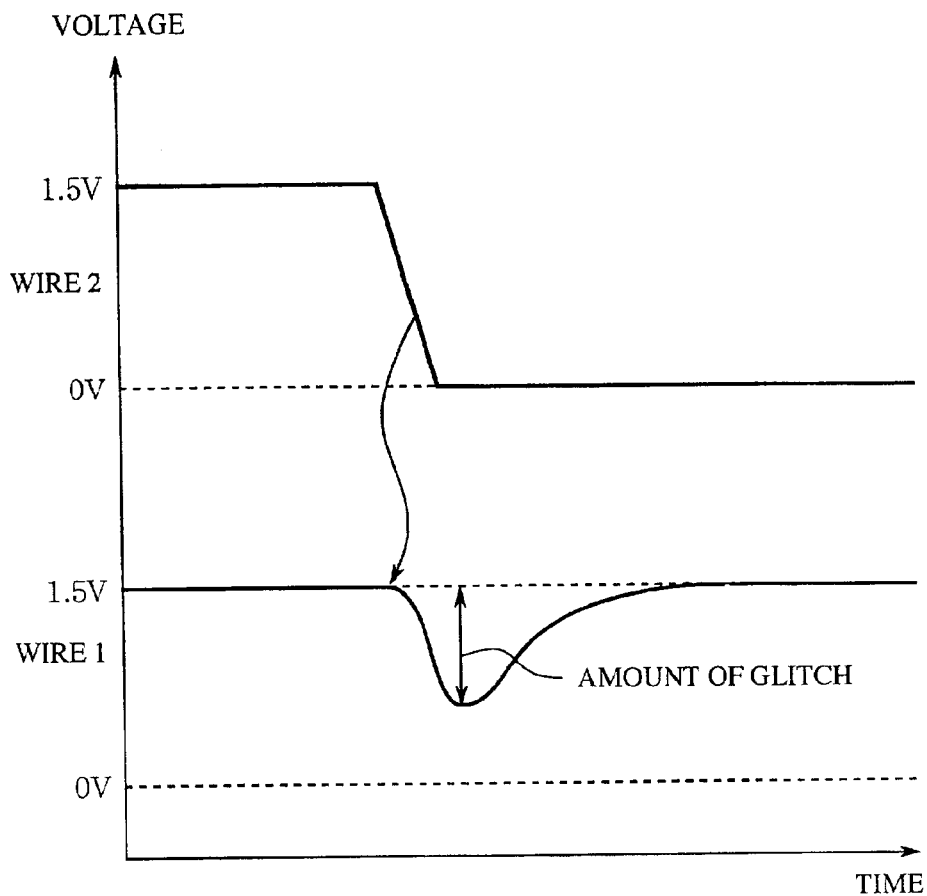
FIG. 2 is a diagram showing the waveforms of signals on wires 1 and 2 for explaining a phenomenon of glitch.

Steps ST1 to ST5 are performed one by one, and the amount V of glitch to be caused in the victim 1 is calculated, in step ST1, when the voltage of the aggressor 2 changes from the power-supply voltage to the ground potential (or, from the ground potential to the power-supply voltage), for example, as shown in FIG. 2. Although the amount of glitch differs according to where the glitch occurs on the victim 1, the amount of glitch at the input of the driver 6 is calculated in this embodiment. It is preferable that the largest amount of glitch that appears on the victim 1 is calculated. The amount of glitch can be calculated by using the coupling capacity Cc between the victim 1 and the aggressor 2, the driving ability of the driver 3, and other parameters.

Next, it is determined, in step ST2, whether the amount V of glitch is equal to or less than a given value Verr or not. The value Verr is predetermined in such a manner that if the amount of glitch is greater than the value Verr, it can be determined that a glitch error occurs If V≦Verr, it is determined that the aggressor 2 does not cause any glitch error in the victim 1, and no circuit modification process such as insertion of one or more buffers into the victim is carried out. If V>Verr, it is determined that there causes a glitch error, and step ST3 is performed.

In step ST3, the one or more positions where one or more buffers are to be inserted into the victim 1 are determined based on the coupling capacity Cc between the victim 1 and the aggressor 2. The coupling capacity Cc, which has already been used to calculate the amount of glitch, is an already-known value at the stage of step ST3. The coupling capacity between the two wires can be calculated with a well-known calculation method using parameters such as the length of each of the two wires, the spacing between the two wires, etc.

Figure 5A:
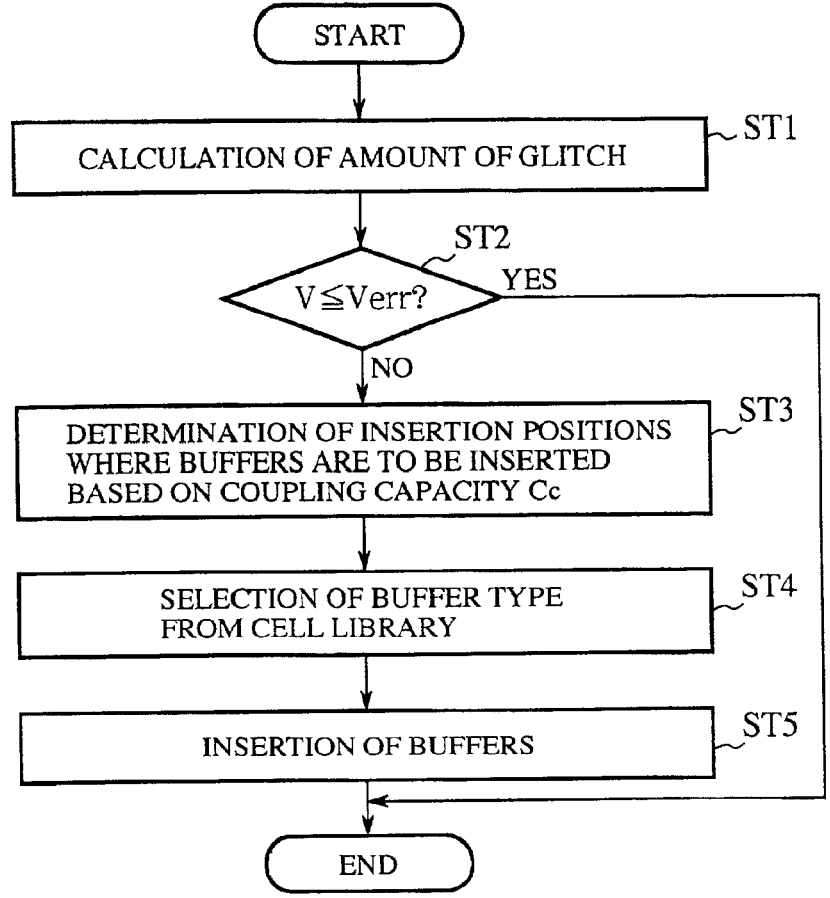
FIGS. 5(a) and 5(b) are flow charts showing the circuit modification method according to the first embodiment of the present invention.
Figure 5B:
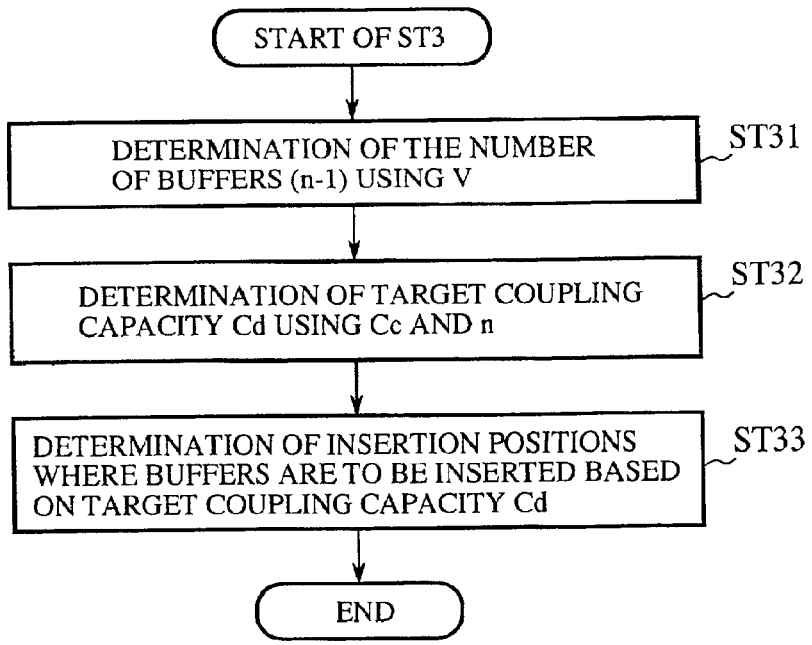

Step ST3 is implemented via steps ST31 to ST33 shown in FIG. 5(b). The number of buffers to be inserted into the victim 1, i.e., the number of segments into which the victim 1 is to be divided through the insertion of the one or more buffers is determined, in step ST31, by using the amount V of glitch calculated in step ST1. Unlike the prior art circuit modification method as shown in FIG. 3, the number of buffers to be inserted into the victim 1 is not fixed to 1, resulting from the detection of a glitch error in step ST2. The number of buffers to be inserted into the victim 1 is determined such that it is increased if the amount V of glitch is large. It is therefore possible to estimate an appropriate number of one or more buffers which can eliminate the glitch error.

In step ST31, a certain amount Vmax of glitch is predetermined, and the smallest possible integer n which satisfies the following relationship: V/n≦Vmax is calculated. The integer n is the number by which the victim i is to be divided into wire segments, and the integer (n−1) is therefore equal to the number of buffers to be inserted into the victim 1. The value Vmax is a target amount of glitch which is defined as a target for the amount of glitch. If the amount of glitch to be caused is equal to or less than Vmax, it can be assumed that the glitch error is eliminated. The value Vmax is predetermined so that it simply satisfies the following relationship Vmax≦Verr. Since the relationship of Vmax≦Verr <V is established, the number n by which the victim 1 is to be divided is calculated and is an integer of 2 or more, and the number of buffers to be inserted into the victim is calculated and is 1 or more.

Vmax=Verr means that the largest possible value Verr which is defined so as to eliminate the glitch error is selected as the value Vmax. It is therefore preferable to set the value Vmax such that it satisfies the following relationship: Vmax<Verr so as to eliminate the glitch error while allowing for a margin corresponding to (Verr−Vmax).

Next, a target coupling capacity Cd is determined, in step ST32, by using the coupling capacity Cc between the victim 1 and the aggressor 2 and the integer n obtained in step ST31. This target coupling capacity Cd indicates the target for the coupling capacity which should exist between each of the plurality of wire segments, into which the victim 1 is to be divided, and the aggressor 2 so as not to cause any glitch error in each wire segment. Using the integer number n by which the victim 1 is to be divided (i.e., the amount V of glitch) and the coupling capacity Cc, the target coupling capacity is easily defined. In accordance with the present embodiment, the target coupling capacity Cd is set to be Cc/n.

The one or more positions where one or more buffers are to be inserted into the victim are determined, in step ST33, based on the target coupling capacity Cd. When the victim 1 is divided into n wire segments, (n−1) internal points of division of the victim 1 are determined as the one or more positions where one or more buffers are to be inserted into the victim 1 so that the coupling capacity between each of the n wire segments and the aggressor 2 should not exceed the target coupling capacity Cd. In accordance with the present embodiment, the (n−1) internal points of division of the victim 1 are determined so that the coupling capacity between each of the n wire segments and the aggressor 2 is almost equal to the target coupling capacity Cd=Cc/n. Since the coupling capacity between each of the n wire segments and the aggressor 2 can be easily calculated with a well-known calculation method using the length of each wire segment, the spacing between each wire segment and the aggressor 2, etc., such the internal points of division are easily calculated.

For example, assume that the victim 1 is divided into two segments in step ST31, and n is therefore determined to be 2 in step ST31. The target coupling capacity Cd=Cc/2 is then calculated in step ST32. To position an internal point A of division on the victim 1, both the coupling capacity Cc1 between the wire segment 1a and the aggressor 2 and the coupling capacity Cc2 between the other wire segment 1b and the aggressor 2 are matched to Cd=Cc/2, as shown in FIG. 4(b), the internal point A of division dividing the victim 1 into the two wire segments 1a and 1b.

Figure 4B:
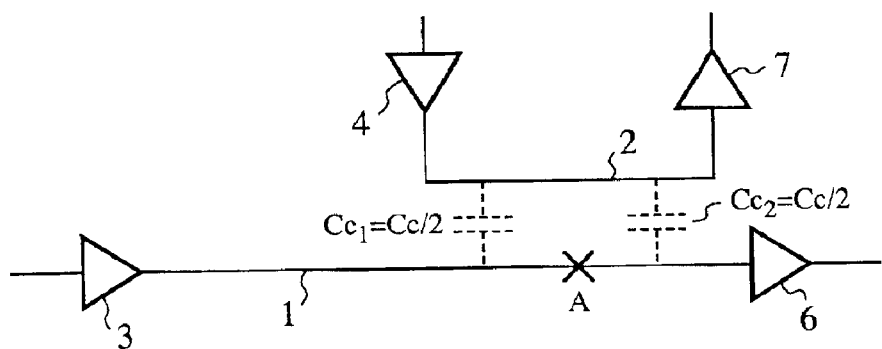

Unlike the prior art circuit modification method, since the one or more internal points of division of the victim 1 are determined so that the coupling capacities between the plurality of wire segments into which the victim 1 is to be divided and the aggressor 2 are almost equal to each other, one or more buffers will be inserted at the one or more internal points (which contribute to the coupling capacities) nearer to the aggressor 2, as shown in FIG. 4(b), not at one or more internal points by which the victim 1 is divided into equal wire segments.

Next, the type of the one or more buffers which are to be inserted into the victim 1 are determined in step ST4. The larger the driving ability of the one or more buffers to be inserted into the victim 1, the larger the amount of glitch is decreased. However, an unlimited increase in the driving ability of the one or more buffers to be inserted into the victim 1 increases the area and power consumption of the circuit. It is preferable to select a type of buffers having a driving ability that can eliminate any glitch error, as well as a small area, as the one or more buffers to be inserted into the victim 1.

The circuit modification method according to the first embodiment of the present invention utilizes a cell library recorded in a storage medium to determine the type of one or more buffers to be inserted into the victim 1. FIG. 6 shows the data structure of the cell library.

The cell library has already been used at the layout design stage. A plurality of types of functional cells (inverter, driver, NAND gate, NOR gate, flip-flop, etc.) are registered in the cell library, and each type of functional cells includes a plurality of cells having different driving abilities and different areas. Data indicating the driving ability of each cell, data indicating the layout area of each cell, and other parameter indicating the features of each cell are registered for each cell while being associated with each cell. The data indicating the layout area of each cell is a layout area to be occupied by the embodied structure of each cell. The data indicating the driving ability of each cell is represented by the resistance value of the source of a MOS transistor that drives the output node of each cell.

In accordance with the first embodiment, one type of cells having a driving ability which does not fall below the driving ability of the driver 3 for driving the victim 1 and a minimum area is selected, as each of all buffers to be inserted into the victim 1, from among driver cells registered in the cell library. In other words, assuming that the resistance of the driver 3's source is Rs(Victim), one type of driver cells of a minimum area having a source resistance value Rs which satisfies the following relationship: Rs Rs(Victim) is selected. Since one driver cell which does not fall below the driver 3's driving ability is selected as each of the one or more buffers to be inserted into the victim, the amount of glitch that occurs in the victim after the insertion of the one or more buffers can be reduced. Moreover, since the driver cell selected has a minimum area, an increase in the area of the circuit according to the buffer insertion can be prevented as much as possible.

Each driver cell registered in the cell library is a circuit that outputs an input logical level just as it is, and is generally constructed of an even number of inverters connected in series. However, since the logical level output by the driver 3 only has to be input to the driver 6, the cell type adopted for each of the one or more buffers to be inserted into the victim is not limited to a driver cell. For example, when the number of buffers to be inserted into the victim is an even number, all the buffers can be inverters. If the number of buffers to be inserted into the victim is 3, the three buffers can be one driver and two inverters. Even if the number of buffers to be inserted into the victim is 4 or more, all the buffers can be constructed of any combination of one or more inverters and one or more drivers so that the logical level output by the driver 3 is input to the driver 6.

Even when an inverter is inserted as each of the one or more buffers to be inserted into the victim 1, one type of inverter cells of a minimum area having a source resistance value Rs which satisfies the following relationship: Rs Rs (Victim) is selected as each buffer from the cell library.

Since step ST4 can be performed independently of step ST3, it is possible to perform step ST4 as an arbitrary step located between step ST2 and step ST5, which will be described below, of inserting the selected one or more buffers into the victim 1.

Figure 4C:
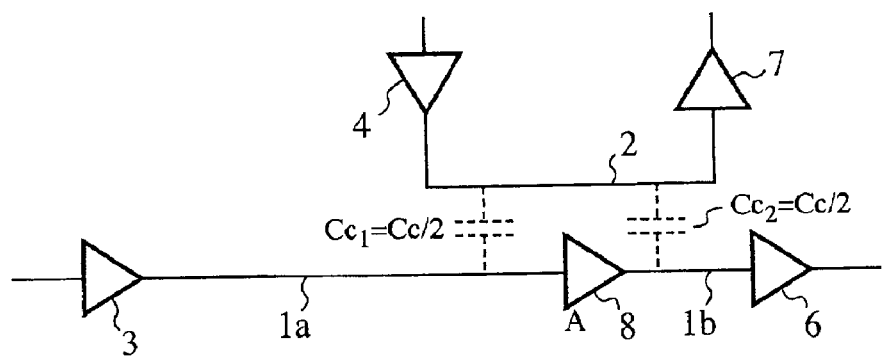

Next, the one or more buffer cells selected in step ST4 are inserted, in step ST5, at the insertion positions determined in step ST3. In the above-mentioned example shown in FIGS. 4($a$) and 4($b$), a buffer 8 is inserted at the internal point A of division of the victim 1, as shown in FIG. 4($c$).

In accordance with the prior art circuit modification method mentioned above, there is a possibility that a glitch error occurs in the wire segment 1$b$, as shown in FIG. 3, and, after all, it is necessary to insert at least two buffers into the victim by further inserting one or more other buffers between the buffer 5 and the driver 6. However, in accordance with the circuit modification method of the first embodiment, since the one or more positions where one or more buffers are to be inserted into the victim are determined based on the coupling capacity Cc between the victim 1 and the aggressor 2, those positions can be obtained so that the coupling capacity Cc can be properly divided into the plurality of coupling capacities between the aggressor 2 and the plurality of wire segments into which the victim is divided, and it is therefore determined that only one buffer to be inserted is needed in the case of FIGS. 4($a$) to 4($c$). The reduction in the number of buffers to be inserted into the victim can reduce either the area or power consumption of the circuit even if the circuit is modified.

As previously mentioned, in accordance with the first embodiment of the present invention, since the number of buffers to be inserted into the victim 1, the one or more positions where the one or more buffers are to be inserted, and the type of the one or more buffers are appropriately estimated according to parameters such as the coupling capacity between a wire, which is a victim, and another wire, which is an aggressor, and the driving ability of the driver 3 for driving the victim, etc., it is possible to modify the circuit while suppressing an increase in either the area or power consumption of the circuit.

Furthermore, although the glitch error judgment as for each of wire segments of the modified circuit and further modification of the circuit are repeated until the glitch error is eliminated, since according to the first embodiment the number of buffers to be inserted into the victim 1, the one or more positions where the one or more buffers are to be inserted, and the type of the one or more buffers are estimated through one glitch error detection and circuit modification in steps ST2 to ST5, it is not necessary to modify the circuit many times, unlike the prior art circuit modification method mentioned above, thus shortening the time required for the circuit modification.

Embodiment 2

Steps ST32 and ST33 of a circuit modification method of a second embodiment of the present invention are implemented via another method. The other steps of the circuit modification method of the second embodiment are the same as those of the circuit modification method of the above-mentioned first embodiment. Step ST31 is not needed for the second embodiment, as will be described below.

In accordance with this embodiment, the target coupling capacity Cd is calculated as follows: Cc*Vmax/V by using the coupling capacity Cc between the victim and the aggressor and the amount of glitch V. The following relationship (Cc*Vmax/V) (Cc/n) is established, where (Cc*Vmax/V) is a limitation value of the coupling capacity. When the amount of glitch that occurs in each of a plurality of wire segments into which the victim 1 is divided becomes equal to a target value Vmax, the coupling capacity between each of the plurality of wire segments and the aggressor is expected to become equal to the limitation value.

In accordance with the second embodiment, one or more internal points of division of the victim 1 are determined so that the coupling capacity between each of the largest possible number of wire segments and the aggressor 2 is matched to (Cc*Vmax/V). Next, a description will be made as to circuit modification processing performed by the circuit modification method according to the second embodiment, taking modification of a circuit of FIG. 7(a) as an example.

process 1: The output terminal X of the driver 3 is defined as a start point.

process 2: The coupling capacity between a wire segment extending from the start point to an arbitrary point on the victim 1 and the aggressor 2 is calculated, and the arbitrary point that provides the target coupling capacity Cd is determined as a first internal point of division of the victim 1.

process 3: It is determined whether the coupling capacity Cc' between the remaining wire segment extending from the internal point of division determined as above and the input point Y of the driver 6 and the aggressor 2 exceeds the target coupling capacity Cd. When determined the coupling capacity Cc' exceeds the target coupling capacity Cd, the above-mentioned internal point of division is set to a new start point and the above-mentioned process 1 is repeated. In contrast, when determined the coupling capacity Cc' does not exceed the target coupling capacity Cd, the circuit modification processing is finished.

Figure 7A:
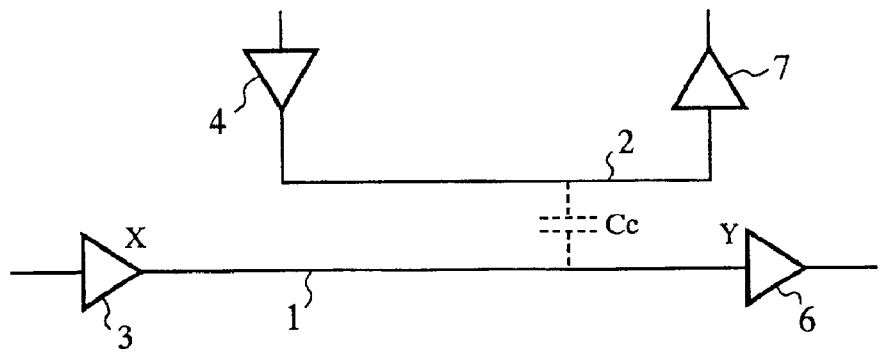
FIGS. 7(a) to 7(d) are explanatory drawings for explaining circuit modification processing performed by using a circuit modification method according to a second embodiment of the present invention.
Figure 7B:
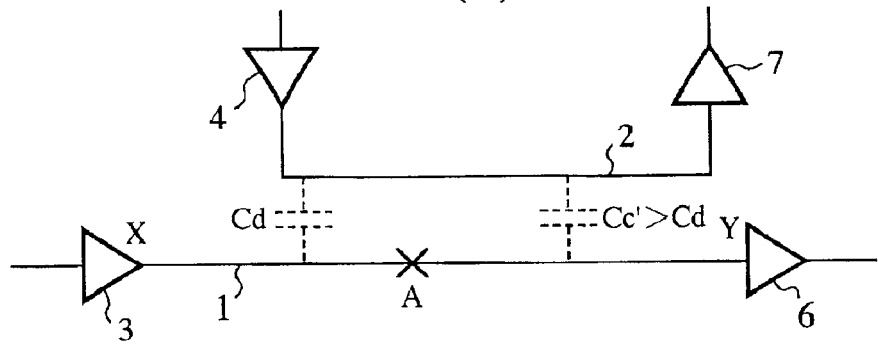
Figure 7C:
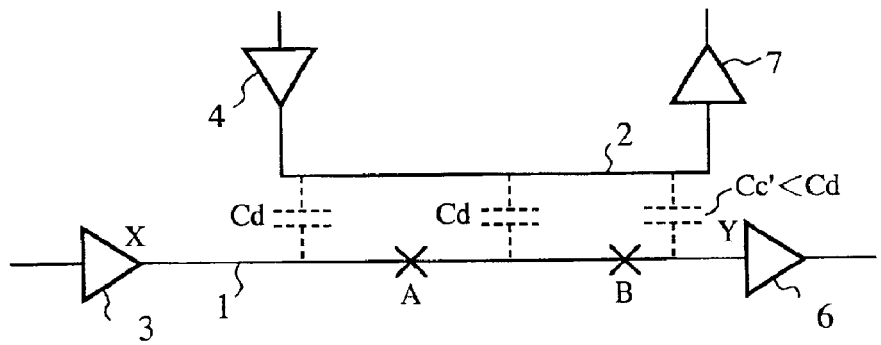

In the case of modifying the circuit of FIG. 7(a), a first internal point of division A is determined through the process 2, as shown in FIG. 7(b). After that, it is determined that the coupling capacity Cc', between the remaining wire segment from A to Y and the aggressor 2 exceeds the target coupling capacity Cd, and therefore a next internal point of division B is also determined through the process 2, as shown in FIG. 7(c). The circuit modification processing is finished when determined that the coupling capacity Cc' between the remaining wire segment from B to Y and the aggressor 2 does not exceed the target coupling capacity Cd. Since the number of buffers to be inserted into the victim is also determined at that time, step ST31 as shown in FIG. 5 is not needed. The start point initially set in the process 1 can alternatively be the input point Y of the driver 6.

The coupling capacity between the wire segment from X to A and the aggressor 2 is the same as the target coupling capacity Cd. The coupling capacity between the wire segment from A to B and the aggressor 2 is the same as the target coupling capacity Cd too. The coupling capacity between the wire segment from B to Y and the aggressor 2 is the same as or less than the target coupling capacity Cd.

Figure 7D:
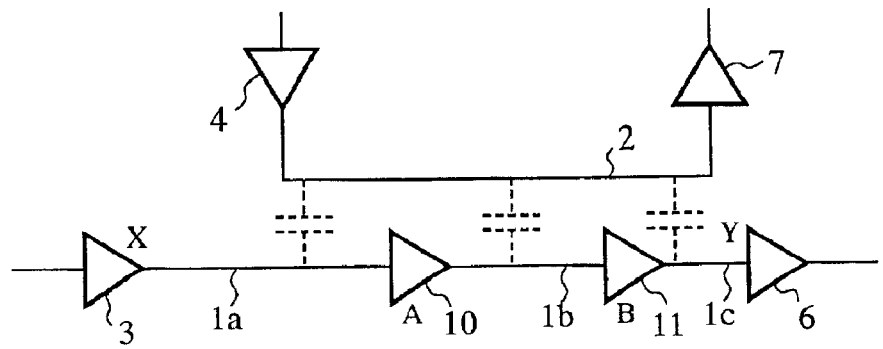

And, two buffers are inserted at the internal points of division A and B according to step ST6 of FIG. 5, as shown in FIG. 7(d). As previously mentioned, in accordance with the second embodiment of the present invention, since the number of buffers to be inserted into the victim, the one or more positions where the one or more buffers are to be inserted, and the type of the one or more buffers are appropriately estimated so that the glitch error is eliminated, it is possible to modify the circuit while suppressing an increase in either the area or power consumption of the circuit.

Embodiment 3

Figure 8A:
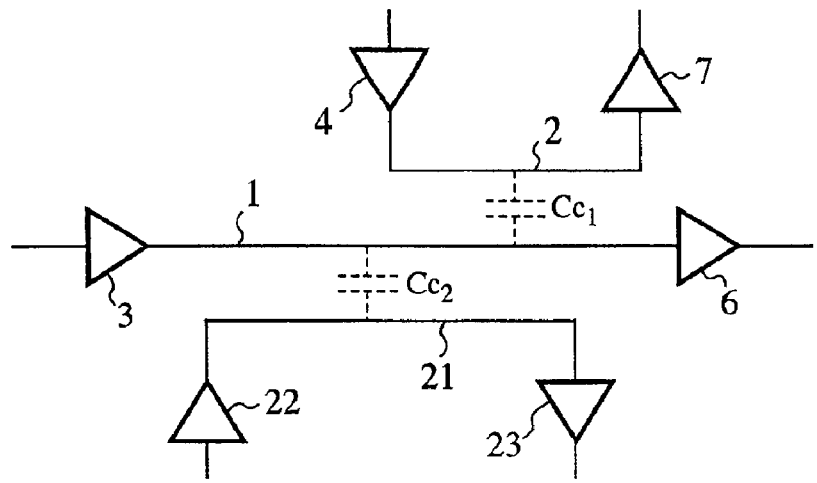
FIGS. 8(a) to 8(c) are explanatory drawings for explaining circuit modification processing performed by using a circuit modification method according to a third embodiment of the present invention.

FIG. 8(a) is a schematic circuit diagram showing a part of a semiconductor integrated circuit to be modified by a circuit modification method of a third embodiment of the present invention. The circuit modification method according to the third embodiment can be applied to the case where there are a plurality of aggressors that influence a victim, and, while there do not cause glitches in the victim simultaneously since signals passing through the plurality of aggressors do not change at the same time, glitch errors can occur in the victim at different times.

The circuit modification method according to the present embodiment is implemented via a computer program disposed as a CAD tool for layout verification. The computer program is recorded in a storage medium which computers can read. A computer can practice the circuit modification method of the third embodiment according to the program read out of the storage medium.

Analysis is performed in advance on a set of plural wires which are disposed within the semiconductor integrated circuit to be modified, and where signal changes cannot occur at the same time. The analysis can be easily carried out based on a logic which constitutes the circuit. In the case of FIG. 8(a), the analysis results in detection of a plurality of aggressors (in this case, two aggressors 2 and 21) each of which causes a glitch in the victim 1, and signals passing through the plurality of aggressors not changing at the same time.

In accordance with the circuit modification method of the third embodiment, steps ST1, ST2, ST31 and ST32, as shown in FIGS. 5(a) and 5(b) of the above-mentioned first embodiment, are performed on each of the two aggressors 2 and 21. In step ST1, the amounts of glitches V1 and V2 which the two aggressors 2 and 21 respectively cause in the victim 1 are calculated. It is then determined, in step ST2, that each of both V1 and V2 exceeds Verr.

In step ST31, the number of segments $n_1$, into which the victim 1 is to be divided with respect to the aggressor 2 is calculated, and the number of segments $n_2$ into which the victim 1 is to be divided with respect to the aggressor 21 is calculated. And, acceptable capacities $Cd_1$ and $Cd_2$ respectively associated with the two aggressors 2 and 21 are calculated in step ST32. They are calculated as follows: $Cd_1=Cc_1/n_1$ and $Cd_2=Cc_2/n_2$, where $Cc_1$, is the coupling capacity between the aggressor 2 and the victim 1 and $Cc_2$ is the coupling capacity between the aggressor 21 and the victim 1.

Figure 8B:
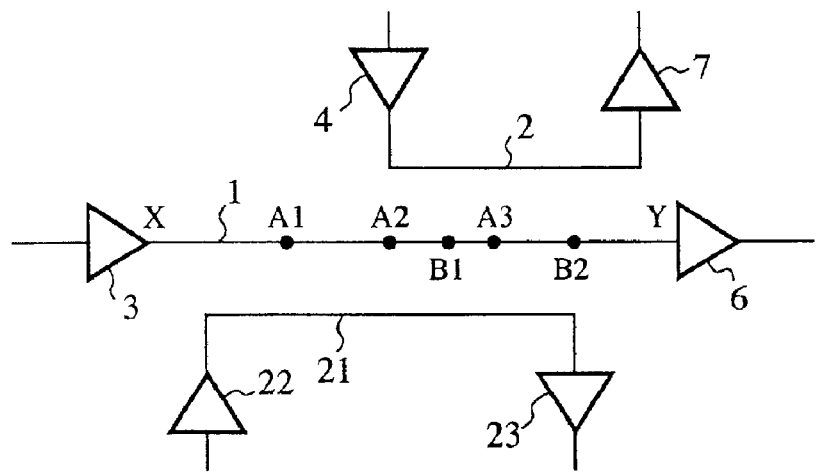

Then, like the above-mentioned first embodiment, one or more internal points of division of the victim 1 with respect to the aggressor 2 are determined so that the coupling capacity between each of the plurality of wire segments into which the victim 1 is divided and the aggressor 2 is equal to the first target coupling capacity $Cd_1$ (first division method). Similarly, one or more other internal points of division of the victim 1 with respect to the aggressor 21 are also determined so that the coupling capacity between each of the plurality of wire segments into which the victim 1 is divided and the aggressor 21 is equal to the second target coupling capacity $Cd_2$ (second division method). For example, in the case of $n_1=3$ and $n_2=4$ as shown in FIG. 8(b), two internal points of division B1 and B2 can be determined according to the first division method, and three other internal points of division A1 to A3 can be determined according to the second division method.

The one or more positions where one or more buffers are to be inserted into the victim 1 are selected from the five internal points of division. The above-mentioned selection is performed so that the following conditions are satisfied: the coupling capacity between each of a plurality of segments of division of the victim 1, which are obtained by inserting one or more buffers at one or more of the five possible positions, and the aggressor 2 is equal to or less than the first target coupling capacity $Cd_1=Cc_1/n_1$ and the coupling capacity between each of the plurality of segments of division of the victim 1 and the aggressor 21 is equal to or less than the second target coupling capacity $Cd_2=Cc_2/n_2$. Therefore, even if signal changes occur in the two aggressors 2 and 21, respectively, any glitch error can be prevented from occurring in each of the plurality of wire segments of division. Furthermore, if the one or more positions where a minimum number of buffers are to be inserted into the victim are selected so that the above-mentioned conditions are satisfied, the number of buffers to be inserted can be decreased compared with the case where the above-mentioned first embodiment is simply applied to each of the two aggressors, as explained as follows.

First of all, the internal points A1 and B2 of division of the victim 1 which are nearest the both ends of the victim are unconditionally determined as insertion positions. In FIG. 8(b), the wire segment from the output point X of the buffer 3 to the internal point of division A1 has a coupling capacity smaller than $Cd_1$ with respect to the aggressor 2, but equal to $Cd_2$ with respect to the aggressor 21. The point of division A1 of the victim 1 is therefore the farthest point from X which provides the coupling capacity between the wire segment from X to any point and the aggressor 21 that does not exceed $Cd_2$. Since the wire segment from the internal point of division B2 to the input point Y of the buffer 6 has a coupling capacity smaller than $Cd_2$ with respect to the aggressor 21, but equal to $Cd_1$ with respect to the aggressor 2. The point of division B2 of the victim 1 is therefore the farthest point from Y which provides the coupling capacity between the wire segment from Y to any point and the aggressor 2 that does not exceed $Cd_1$.

Next, the wire segment from A1 to A2 is examined. Since the wire segment from A1 to A2 has a coupling capacity smaller than $Cd_1$ with respect to the aggressor 2, but equal to $Cd_2$ with respect to the aggressor 21. The point of division A2 of the victim 1 is therefore the farthest point from A1 which provides the coupling capacity between the wire segment from A1 to any point and the aggressor 21 that does not exceed $Cd_2$. Therefore, the internal point of division A2 is determined as the position where one buffer is to be inserted into the victim 1.

Next, the wire segment from A2 to B1 is examined. Since this wire segment from A2 to B1 has a coupling capacity smaller than $Cd_1$ with respect to the aggressor 2, and smaller than $Cd_2$ with respect to the aggressor 21, a further point from A2 than the point B1 can be selected as a position where one buffer is to be inserted into the victim 1. The wire segment from A2 to A3 is then examined as follows. This wire segment from A2 to A3 has a coupling capacity equal to $Cd_2$ with respect to the aggressor 21, and it is therefore determined whether the coupling capacity between the wire segment from A2 to A3 and the aggressor 2 exceeds $Cd_1$. The internal point A3 has to be selected as a position where one buffer is to be inserted into the victim 1 when the coupling capacity between the wire segment from A2 to A3 and the aggressor 2 does not exceed $Cd_1$, and it is impossible to select the internal point A3 otherwise.

Next, the wire segment from B1 to A3 is examined. Since this wire segment from B1 to A3 has a coupling capacity smaller than $Cd_1$ with respect to the aggressor 2, and smaller than $Cd_2$ with respect to the aggressor 21, a further point from B1 than A3 can be selected as a position where one buffer is to be inserted into the victim 1. The wire segment from B1 to B2 is then examined as follows. This wire segment from B1 to B2 has a coupling capacity equal to $Cd_1$ with respect to the aggressor 2, and it is therefore determined whether the coupling capacity between the wire segment from B1 to B2 and the aggressor 21 exceeds, $Cd_2$. The internal point B1 has to be selected as a position where one buffer is to be inserted into the victim 1 when the coupling capacity between the wire segment from B1 to B2 and the aggressor 21 does not exceed $Cd_2$, and it is impossible to select the internal point B1 otherwise.

It is apparent from the above-mentioned results that (1): when the coupling capacity between the wire segment from A2 to A3 and the aggressor 2 does not exceed $Cd_1$, and the coupling capacity between the wire segment from B1 to B2 and the aggressor 21 does not exceed $Cd_2$, either B1 or A3 can be selected as a position where one buffer is to be inserted into the victim 1, (2): when the coupling capacity between the wire segment from A2 to A3 and the aggressor 2 does not exceed $Cd_1$, and the coupling capacity between the wire segment from point B1 to B2 and the aggressor 21 exceeds $Cd_2$, A3 can be selected as a position where one buffer is to be inserted into the victim 1 while B1 cannot be selected as a position where one buffer is to be inserted into the victim 1, (3): when the coupling capacity between the wire segment from A2 to A3 and the aggressor 2 exceeds $Cd_1$, and the coupling capacity between the wire segment from B1 to B2 and the aggressor 21 does not exceed $Cd_2$, B1 can be selected as a position where one buffer is to be inserted into the victim 1 while A3 cannot be selected as a position where one buffer is to be inserted into the victim 1, (4): when the coupling capacity between the wire segment from A2 to A3 and the aggressor 2 exceeds $Cd_1$, and the coupling capacity between the wire segment from point B1 to B2 and the aggressor 21 exceeds $Cd_2$, both A3 and B1 can be selected as a position where one buffer is to be inserted into the victim 1.

Particularly, in the case of (1) to (3), the number of buffers to be inserted into the victim 1 to eliminate glitch errors is 4, and it is therefore decreased by only one compared with the case of applying the above-mentioned first embodiment to each of the two aggressors.

Figure 8C:
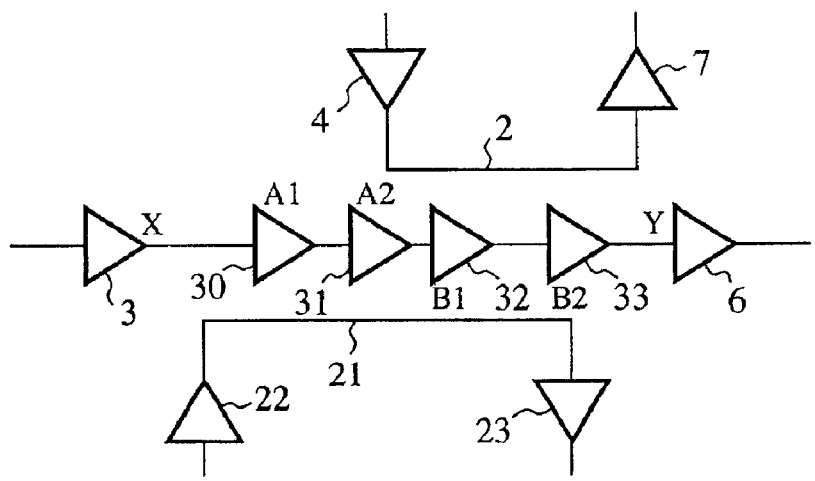

When the four internal points A1, A2, B1, and B2 are selected, four buffers 30 to 33 are inserted at these points selected, respectively, as shown in FIG. 8(c), after the type of the buffers to be inserted into the victim 1 is determined according to step ST5, as shown in FIG. 5(a), of the circuit modification method of the above-mentioned first embodiment.

In accordance with the third embodiment, when it is determined that only one of the two aggressors 2 and 21 causes a glitch error in the victim 1, the circuit modification method according to the above-mentioned first embodiment only has to be applied to the only aggressor that causes a glitch error in the victim. When determined that neither of the two aggressors 2 and 21 causes any glitch error in the victim 1, any circuit modification is not performed on the circuit.

The circuit modification method according to the third embodiment can be applied to any case where the number of aggressors that can cause a glitch error in the victim 1 is an arbitrary one other than 2. Assuming that the coupling capacity between each of k aggressors and the victim 1 is $Cc_i$ (i=1 to k), and the number of segments into which the victim is to be divided with respect to each of the plurality of aggressors is $n_i$ (i=1 to k) in step ST31, the target coupling capacity for each of the plurality of aggressors is calculated as follows: $Cc_i/n_i$ (i=1 to k). One or more internal points of division at which the victim 1 is to be divided into a plurality of wire segments are determined so that the coupling capacity between each of the plurality of segments obtained through the division and each of the plurality of aggressors is equal to $Cc_i/n_i$ (i=1 to k). In this case, the number of all internal points of division of the victim 1 becomes ($n_1 + n_2 + \ldots + n_k$). Then, some are selected from among all the internal points of division so that each of a plurality of wire segments, into which the victim 1 is divided when a plurality of buffers are actually inserted at the number of points selected, has a coupling capacity between itself and each of the plurality of aggressors that does not exceed $Cc_i/n_i$ (i=1 to k).

Embodiment 4

A circuit modification method of a fourth embodiment of the present invention has the step of determining the one or more positions where one or more buffers are to be inserted into the victim 1, which is implemented via a method different from that which the above-mentioned third embodiment employs. The other steps of the method are the same as those of the above-mentioned third embodiment. However, step ST31 performed for each of a plurality of aggressors is not needed, as will be described below.

In accordance with the fourth embodiment, the target coupling capacity $Cd_1$ for each of the plurality of aggressors is calculated as follows: $Cd_i=Cc_i*Vmax/V_i$. And, one or more internal points of division of the victim are determined so that each of a plurality of wire segments, into which the victim is divided when a plurality of buffers are actually inserted at the number of points determined, has a coupling capacity between itself and each of the plurality of aggressors that does not exceed $Cd_i$. The determined one or more internal points of division are defined as the one or more positions where one or more buffers are to be inserted into the victim 1.

Since the following relationship: $Cc_i*Vmax/V_iCc_i*n_i$ is satisfied by definition, it is also possible to determine a less number of buffers compared with the above-mentioned third embodiment.

Figure 9A:
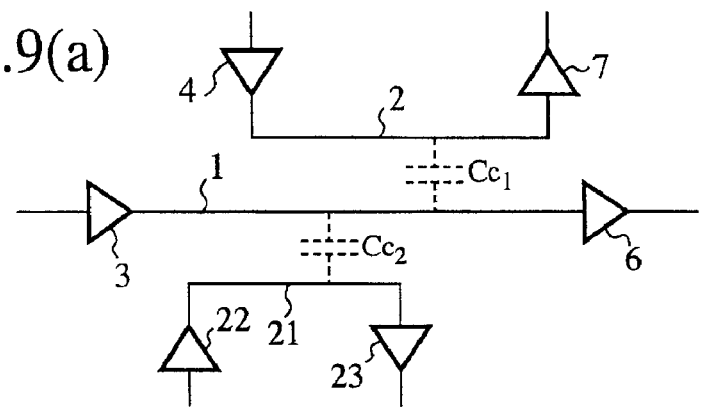
FIGS. 9(a) to 9(d) are explanatory drawings for explaining circuit modification processing performed by using a circuit modification method according to a fourth embodiment of the present invention.

Hereafter, assume that in the case of k=2 as shown in FIG. 9(a), both of the two aggressors 2 and 21 in which signal changes do not occur simultaneously cause glitch errors in the victim 1. Assume that the aggressor 2 has a coupling capacity $Cc_1$ with the victim 1, the aggressor 2 causes an amount $V_1$ of glitch in the victim 1, and a target coupling capacity with respect to the aggressor 2 is $Cd_1=Cc_1*Vmax/V_1$. Similarly, assume that the aggressor 21 has a coupling capacity $Cc_2$ with the victim 1, the aggressor 21 causes an amount $V_2$ of glitch in the victim 1, and a target coupling capacity with respect to the aggressor 21 is $Cd_2=Cc_2*Vmax/V_2$.

In accordance with the fourth embodiment, one or more internal points of division of the victim are determined so that the largest possible number of wire segments into which the victim is to be divided have a coupling capacity with one of the plurality of aggressors, which is equal to a corresponding target capacity $Cd_1$. To this end, the following processes are carried out.

process 1: The output point X of the driver 3 is set as a start point.

process 2: The endpoint of the wire segment extending from the start point X having a coupling capacity with the aggressor 2 that does not exceed the target coupling capacity $Cd_1$ and a coupling capacity with the aggressor 21 that does not exceed the target coupling capacity $Cd_2$, and having a maximum length is determined as a position where one buffer is to be inserted into the victim 1.

process 3: It is determined whether the coupling capacity $C_1'$ between the remaining wire segment from the point of division determined in process 2 to the input point Y of the driver 6 and the aggressor 2 exceeds the target coupling capacity $Cd_1$, and whether the coupling capacity $C_2'$ between the remaining wire segment and the aggressor 21 exceeds the target coupling capacity $Cd_2$. When determined that either of the coupling capacities $C_1'$ and $C_2'$ exceeds the corresponding target coupling capacity, the above-mentioned endpoint is set as a new start point and the process 2 is repeated, and, otherwise, the circuit modification processing is finished.

Figure 9B:
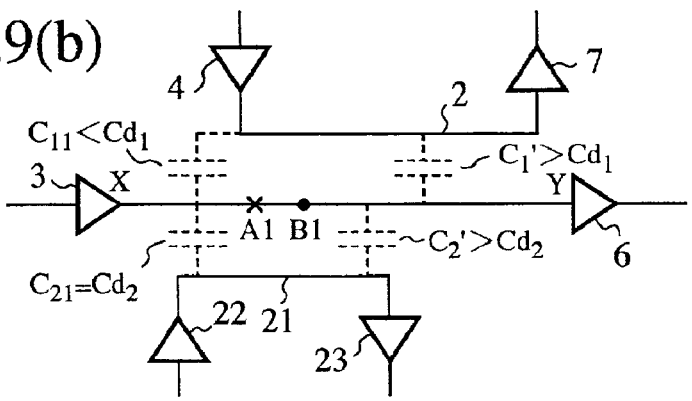

In the case of modifying the circuit of FIG. 9(a), assume that the wire segment from X to A1 has a coupling capacity $C_{11}$ with the aggressor 2 smaller than $Cd_1$ and a coupling capacity $C_{21}$ with the aggressor 21 equal to $Cd_2$, as shown in FIG. 9(b). Then, it is easily understood that the endpoint of a wire segment extending from X and having a coupling capacity with the aggressor 2 equal to $Cd_1$ is B1 which is nearer to the driver 6 than A1. However, the wire segment from X to B1 has a coupling capacity with the aggressor 21 that exceeds $Cd_2$. Therefore, according to the process 2 A1 is determined as a position where one buffer is to be inserted into the victim 1 while B1 is not determined as a position where one buffer is to be inserted into the victim 1.

It is then assumed that the remaining wire segment from A1 to the input point Y of the driver 6 has a coupling capacity $C_1'$ with the aggressor 2 that exceeds $Cd_1$ and a coupling capacity $C_2'$ with the aggressor 21 that exceeds $Cd_2$, as shown in FIG. 9(b). In accordance with the process 3, A1 is set as a new start point and the process 2 is carried out.

Figure 9C:
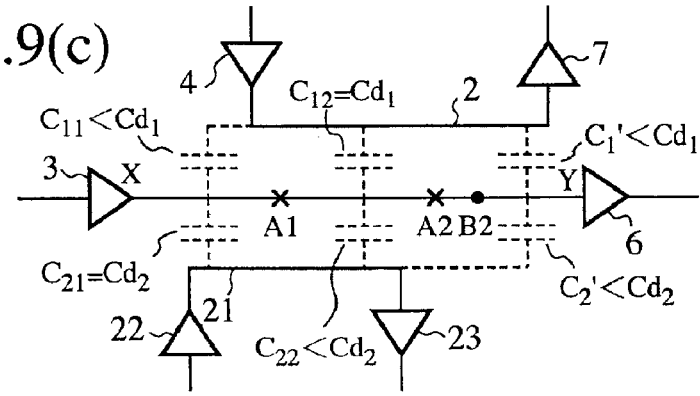

It is further assumed that the wire segment from A1 to A2 has a coupling capacity $C_{22}$ with the aggressor 21 smaller than $Cd_2$ and a coupling capacity $C_{12}$ with the aggressor 2 equal to $Cd_1$, as shown in FIG. 9(c). Then, it is easily understood that the endpoint of a wire segment extending from A1 and having a coupling capacity with the aggressor 21 equal to $Cd_2$ is B2 which is nearer to the driver 6 than A2. However, the wire segment from A1 to B2 has a coupling capacity with the aggressor 2 that exceeds $Cd_1$. Therefore, A2 is determined as a position where one buffer is to be inserted into the victim 1 while B2 is not determined as a position where one buffer is to be inserted into the victim 1.

Assuming that the remaining wire segment from A2 to the input point Y of the driver 6 has a coupling capacity $C_1'$ with the aggressor 2 smaller than $Cd_1$ and a coupling capacity $C_2'$ with the aggressor 21 smaller than $Cd_2$, as shown in FIG. 9(c), the detection of further positions where buffers are to be inserted into the victim 1 is then completed in accordance with the process 3.

Figure 9D:
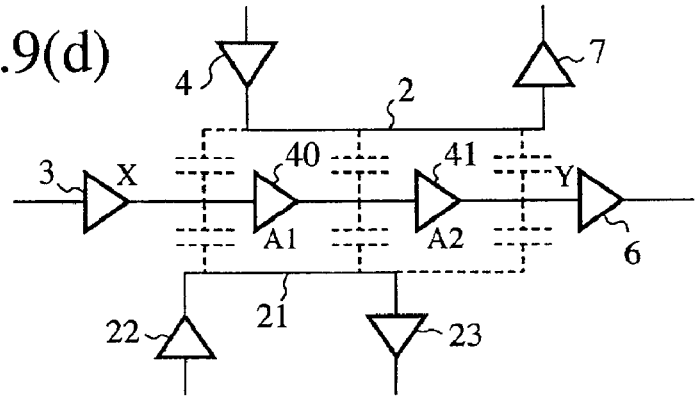

The three wire segments from X to A1, from A1 to A2, and from A2 to Y therefore have a coupling capacity with the wire 2 which does not exceed $Cd_1$, and a coupling capacity with the other wire 21 which does not exceed $Cd_2$. And, after the type of buffers 40 and 41 to be inserted into the victim 1 is determined in step ST4 of FIG. 5(a), the buffers are inserted at the determined points A1 and A2, as shown in FIG. 9(d).

Embodiment 5

In each of the above-mentioned first to fourth embodiments, it is assumed that each aggressor illustrated consists of one wire. However, there may be cases where though a signal change in only one wire does not cause any glitch error in a victim, simultaneous low-to-high or high-to-low signal transitions in a plurality of wires can cause a glitch error in the victim.

A plurality of wires in which signal changes can occur at the same time can constitute one aggressor. By assuming the sum of a plurality of coupling capacities each of which is the one between each of a plurality of wires which constitutes an aggressor and a victim to be the coupling capacity between the victim and the aggressor, the circuit modification method according to either of the above-mentioned first to fourth embodiments can be applied. In this case, it is analyzed beforehand whether signal changes can occur at the same time in the plurality of wires based on a logic which constitutes the logical circuit.

Embodiment 6

In addition to the steps included in either of the above-mentioned first to fifth embodiments, a circuit modification method according to a sixth embodiment of the present invention further comprises the steps of replacing the driving circuit (driver 3) for driving the victim 1 with another driving circuit with a higher driving ability when determined that at least the aggressor 2 (or aggressor 21) causes a glitch error in the victim 1, and further determining whether the aggressor 2 (or aggressor 21) causes a glitch error in the modified victim 1. After it is determined that the aggressor 2 (or aggressor 21) causes a glitch error in the modified victim 1, the steps of determining the one or more positions where one or more buffers are to be inserted into the victim and determining the type of the one or more buffers to be inserted, which are adopted by the above-mentioned first to fifth embodiments, can be carried out.

For example, in the case where the layout of the circuit is designed as shown in FIG. 4(a), if it is determined, in step ST2 of FIG. 5(a), that a glitch error can occur in the victim 1, the driver 3 is replaced by another driver with a higher driving ability. Concretely, a type of functional cells (a type of driver cells in this case) having the same function as the driver 3 is selected from the cell library shown in FIG. 6. If the circuit for driving the victim 1 is a NAND gate, NAND cells are selected, and if it is a NOR gate, NOR cells are selected.

And, a functional cell (driver cell in this case) having the largest driving ability (i.e., the smallest source resistance value) is further selected from among the type of functional cells selected from the cell library. The driver 3 is then replaced by the selected functional cell.

The amount of glitch to be caused in the victim 1, which is driven by the selected functional cell, by the aggressor 2 is calculated, and it is determined whether the calculated amount of glitch exceeds a given value Verr. When the calculated amount of glitch exceeds Verr, step ST3 of determining the one or more positions where one or more buffers are to be inserted into the victim 1 is performed, and, otherwise, no circuit modification is performed.

By improving the driving ability of the driving circuit for driving the victim 1 before determining the one or more positions where one or more buffers are to be inserted into the victim, the amount of glitch to be caused in the victim 1 in which the driving circuit has been replace by another driver cell is reduced. Therefore, there is a possibility that the number of buffers to be inserted determined in step ST3 is decreased. Furthermore, when the driving circuit for driving the victim 1 is replaced by another driver cell in accordance with the sixth embodiment, in step ST5 in FIG. 5(a), a type of buffer having a higher driving ability than that of the other driver cell and having a minimum area is selected as each of the one or more buffers to be inserted into the victim 1 from the cell library. Therefore, the selection of a type of buffer having a high driving ability can reduce the length of delay time to be caused in the victim 1 which is otherwise increased by occurrence of glitch errors.

Many widely different embodiments of the present invention may be constructed without departing from the spirit and scope of the present invention. It should be understood that the present invention is not limited to the specific embodiments described in the specification, except as defined in the appended claims.

What is claimed is:

1. A circuit modification method of modifying a circuit by inserting one or more buffers into a predetermined wire located within the circuit, the method comprising the steps of:

determining whether a glitch error is caused in said predetermined wire by one or more aggressors each comprised of one or more other wires;

when determining that a glitch error as caused in said predetermined wire by one or more aggressors, determining one or more positions where one or more buffers are to be inserted into said predetermined wire based on a coupling capacity between each of said one or more aggressors and said predetermined wire, wherein said insertion position determining step includes the steps of, when determining that a glitch error is caused in said predetermined wire by only one aggressor, calculating a target coupling capacity using the coupling capacity between said aggressor and said predetermined wire, and, when dividing said predetermined wire into a plurality of wire segments, determining one or more internal points of division of said predetermined wire so that a coupling capacity between each of said plurality of wire segments and said aggressor does not exceed said target coupling capacity, and setting said one or more internal points of division to said one or more positions where said one or more buffers are to be inserted into said predetermined wire.

2. The circuit modification method according to claim 1, wherein said target coupling capacity calculating step is the step of calculating said target coupling capacity by using an amount of glitch to be caused in said predetermined wire by said aggressor.

3. The circuit modification method according to claim 2, wherein said target coupling capacity calculating step includes the steps of determining the number of said plurality of wire segments based on said amount of glitch, and calculating said target coupling capacity based on said coupling capacity between said aggressor and said predetermined wire and the number of said plurality determined in the above step.

4. The circuit modification method according to claim 3, wherein said wire segment number determining step is the step of, when the coupling capacity between said aggressor and said predetermined wire is Cc, said amount of glitch is V, and a predetermined value is Vmax, determining the smallest integer number n which satisfies a following relationship: V/n Vmax as the number of said plurality of wire segments, and wherein said target coupling capacity calculating step is the step of calculating said target coupling, capacity as follows: Cc/n, and said internal division point determining step is the step of determining said one or more internal points at division so that the coupling capacity between each of said plurality of wire segment and said aggressor is equal to said target coupling capacity Cc/n.

5. The circuit modification method according to claim 2, wherein said target coupling capacity calculating step is the step of, when the coupling capacity between said aggressor and said predetermined wire is Cc, said amount of glitch is V, and a predetermined value is Vmax, calculating said target coupling capacity as follows: Cc*Vmax/V.

6. The circuit modification method according to claim 2, wherein said one or more buffers to be inserted into said predetermined wire have a driving ability equal to or greater than that of a driving circuit for driving said predetermined wire.

7. The circuit modification method according to claim 6, further comprising the step of selecting a type of buffer having a driving ability equal to or greater than that of said driving circuit for driving said predetermined wire and having a minimum area as each of said one or more buffers to be inserted into said predetermined wire from among a plurality of buffer cells stored in a cell library.

8. The circuit modification method according to claim 1, further comprising the steps of, when determining that a glitch error is caused in said predetermined wire by one or more aggressors, replacing a driving circuit for driving said predetermined wire with another one having a higher driving ability than the driving circuit, and, before performing said insertion position determining step, determining whether a glitch error is caused in said predetermined wire driven by the other driving circuit by said one or more aggressors.

9. A circuit modification method of modifying a circuit by inserting one or more buffers into a predetermined wire located within the circuit, the method comprising the steps of:

determining whether a glitch error is caused in said predetermined wire by one or more aggressors each comprised of one or more other wires;

when determining that a glitch error is caused in said predetermined wire by one or more aggressors, determining one or more positions where one or more buffers are to be inserted into said predetermined wire based on a coupling capacity between each of said one or more aggressors and said predetermined wire, wherein said insertion position determining step includes the steps of, when determining that a glitch error as caused in said predetermined wire by a plurality of aggressors, calculating a plurality of target coupling capacities respectively associated with said plurality of aggressors by using the coupling capacity between each of said plurality of aggressor and said predetermined wire, and, when diving said predetermined wire into a plurality of wire segment, determining one or more internal points of division of said predetermined wire so that a coupling capacity between each of said plurality of wire segments and each of said plurality of aggressors does not exceed a corresponding one of said plurality of target coupling capacities, and setting said one or more internal points of division to said one or more positions where said one or more buffers are to be inserted into said predetermined wire.

10. The circuit modification method according to claim 9, wherein said target coupling capacity calculating step includes the steps of, when the coupling capacity between each of said plurality of aggressors (referred to as ith (i=1 to k, k is the number of aggressors) aggressor hereafter) and said predetermined wire is $Cc_i$ (i=1 to k), an amount of glitch to be caused in said predetermined wire by the ith aggressor is $V_i$ (i=1 to k), and a predetermined value is Vmax, determining the smallest integer number $n_i$ (i=1 to k) which satisfies a following relationship: $V_i/n_i$ Vmax (i=1 to k) as the number of said plurality of wire segments for each of said plurality of aggressors, and calculating each of said plurality of target coupling capacities as follows: $Cc_i/n_i$ (i=1 to k).

11. The circuit modification method according to claim 9, wherein said insertion position determining step includes the steps of when dividing said predetermined wire into a plurality of wire segments for each of said plurality of aggressors, determining said one or more internal points of division of said predetermined wire so that the coupling capacity between each of said plurality of wire segment and each of said plurality of aggressor is equal to said corresponding target coupling capacity, and selecting said one or more positions where one or more buffers to be inserted into said predetermined wire from among all internal points of division determined in the above step for said plurality of aggressors.

12. The circuit modification method according to claim 10, wherein said insertion position determining step includes the steps of when dividing said predetermined wire into a plurality of wire segments for each of said plurality of aggressors, i.e., said ith aggressor, determining said one or more internal points of division of said predetermined wire so that the coupling capacity between each of said plurality of wire segment and said ith aggressor is equal to said corresponding target coupling capacity $Cc_i/n_i$ (i=1 to k), and selecting said one or more positions where one or more buffers to be inserted into said predetermined wire from among all internal points of division determined in the above step for said plurality of aggressors.

13. The circuit modification method according to claim 9, wherein said target coupling capacity calculating step includes the steps of, when the coupling capacity between each of said plurality of aggressors (referred to as ith (i=1 to k, k is the number of aggressors) aggressor hereafter) and said predetermined wire is $Cc_i$ (i=1 to k), an amount of glitch to be caused in said predetermined wire by said ith aggressor is $V_i$ (i=1 to k), and a predetermined value is Vmax, calculating each of said plurality of target coupling capacities as follows: $Cc_1 * Vmax/V_i$ (i=1 to k).

14. A circuit modification method of modifying a circuit by inserting one or more buffers into a predetermined wire located within the circuit, the method comprising the steps of:

determining whether a glitch error is caused in said predetermined wire by an aggressor comprised of one or more other wires;

when determining that a glitch error is caused in said predetermined wire by an aggressor, determining a number of buffers to be inserted into said predetermined wire based on an amount of glitch to be caused in said predetermined wire by said aggressor.

15. The circuit modification method according to claim 14, wherein said buffer number determining step is the step of, when said amount of glitch is V and a predetermined value is Vmax, calculating the smallest integer number n which satisfies a following relationship: V/n Vmax.

16. The circuit modification method according to claim 14, wherein said one or more buffers to be inserted into said predetermined wire have a driving ability equal to or greater than that of a driving circuit for driving said predetermined wire.

17. The circuit modification method according to claim 16, further comprising the step of selecting a type of buffer having a driving ability equal to or greater than that of said driving circuit for driving said predetermined wire and having a minimum area as each of said one or more buffers to be inserted into said predetermined wire from among a plurality of buffer cells stored in a cell library.

18. The circuit modification method according to claim 14, further comprising the steps of, when determining that a glitch error is caused in said predetermined wire by one aggressor, replacing a driving circuit for driving said predetermined wire with another one having a higher driving ability than the driving circuit, and, before performing said buffer number determining step, determining whether a glitch error is caused in said predetermined wire driven by the other driving circuit by said one aggressor.

* * * * *